United States Patent
Vendrame et al.

(10) Patent No.: US 6,700,226 B2
(45) Date of Patent: Mar. 2, 2004

(54) MULTI-EMITTER BIPOLAR TRANSISTOR FOR BANDGAP REFERENCE CIRCUITS

(75) Inventors: Loris Vendrame, Carbonera (IT); Paolo Caprara, Milan (IT); Giorgio Oddone, Rossiglione (IT); Antonio Barcella, Trescore Balneario (IT)

(73) Assignee: STMicroelectronic S.r.l., Agrate Brianza (IT)

( * ) Notice: Subject to any disclaimer, the term of this patent is extended or adjusted under 35 U.S.C. 154(b) by 49 days.

(21) Appl. No.: 10/035,006

(22) Filed: Dec. 27, 2001

(65) Prior Publication Data

US 2002/0149089 A1 Oct. 17, 2002

(30) Foreign Application Priority Data

Dec. 28, 2000 (EP) .............................. 00830851

(51) Int. Cl.⁷ .............................................. H01L 29/73
(52) U.S. Cl. ....................... 307/148; 257/579; 257/584; 257/587
(58) Field of Search ........................ 307/148; 257/579, 257/584, 587; 561/100

(56) References Cited

FOREIGN PATENT DOCUMENTS

| | | |
|---|---|---|
| EP | 439 163 A2 | 7/1991 |
| FR | 1546423 | 12/1967 |

OTHER PUBLICATIONS

European Search Report dated Aug. 20, 2001 for European Patent Application No. 00830851.

Primary Examiner—Gregory J. Toatley, Jr.
Assistant Examiner—Robert L DeBeradinis
(74) Attorney, Agent, or Firm—Lisa K. Jorgenson; Jose Gutman; Fleit, Kain, Gibbons, Gutman, Bongini & Bianco P.L.

(57) ABSTRACT

A transistor includes a substrate region (14) of a first type (P) of conductivity in a semiconductor material layer of the same type (P) of conductivity, at least a first contact region (13) of the first type (P+) of conductivity inside the substrate region (14) and adjacent to a first terminal (C) of the transistor, a well (11) of second type (N) of conductivity placed inside the substrate region (14), wherein the well (11) of second type (N) of conductivity includes at least a second contact region (12) of a second type of conductivity (N+) adjacent to a region of a second terminal (B) of the transistor, and a plurality of third contact regions (10) of the first type of conductivity (P+) adjacent to a plurality of regions of a third terminal (E1, . . . , E3) of the transistor interposed each one (10) and other (12) by proper insulating shapes (20).

8 Claims, 4 Drawing Sheets

MULTI-EMITTER BIPOLAR TRANSISTOR FOR BANDGAP REFERENCE CIRCUITS

CROSS-REFERENCE TO RELATED APPLICATION

This application is based upon and claims priority from prior European Patent Application No. 00830851.2, filed on Dec. 28, 2000, the entire disclosure of which is herein incorporated by reference.

BACKGROUND OF THE INVENTION

1. Field of the Invention

The invention generally relates to a multi-emitter bipolar transistor for bandgap reference circuits, and more particularly to a multi-emitter vertical bipolar transistor to be used as reference in bandgap circuits.

2. Description of the Related Art

In the modern microelectronic devices based on CMOS technology voltages are internally produced and used, such as, for example, negative voltages and/or high voltages, distinct from supply voltage.

The circuits for the management of the various produced voltages need of a precise and stable voltage reference both at the supply voltage oscillations and at the temperature changes. A reference of such a nature is obtained by means of a circuit known as "bandgap reference".

Such a circuit usually uses bipolar transistors so as to make full use of the characteristic of the bipolar transistors to have a current voltage law exponentially linked, in turn correlated with the energetic gap of the starting semiconductor.

In fact the way of working of the bandgap circuits provides for comparing the current flowing in a bipolar with that flowing in other "n" bipolars connected in parallel. Each one of "n+1" bipolars is connected as diode, that is it has the base and collector electrodes short circuited.

In the reference bandgap circuits, implemented by CMOS technology with p type substrate, or implemented in technologies according to which masks or specific steps are not provided to realize bipolar transistors, pnp type vertical transistors are used.

For a n type substrate the dual principle is valid.

The pnp transistor is implemented making opportunely full use of some steps and necessary structures for the realization of complementary MOSFET transistors, that is the availability of an usual P+ implant, adapted for making the source and drain junction of the MOSFET transistors, and of a N well, adapted for making the channel of the MOS transistor with p channel and the p substrate itself, makes easily available the possibility to obtain the pnp vertical bipolar transistor.

In the process of implementation of these pnp type vertical bipolar transistors all the projecting laws relating to the distances and minimum sizes, relating to the active areas in the N well and to the P+ active areas placed in the substrate around the N well should be respected.

By implementing a structure with this standard CMOS technology a remarkable waste of area is obtained and, therefore, there is a lower integration of the devices.

Moreover an adequate electric coupling among the devices making the circuit is not obtainable.

Accordingly, there exists a need for overcoming the disadvantages of the prior art as discussed above.

SUMMARY OF THE INVENTION

In view of the state of the art described, a multi-emitter bipolar transistor for bandgap reference circuits, according to a preferred embodiment of the present invention, is able to avoid to the problems of the prior art.

According to a preferred embodiment of the present invention, a transistor comprises a substrate region of a first type of conductivity in a semiconductor material layer of the same type of conductivity, at least a first contact region of the first type of conductivity inside the substrate region and adjacent to a first terminal of the transistor, a well of second type of conductivity placed inside the substrate region, wherein the well of second type of conductivity comprises at least a second contact region of a second type of conductivity adjacent to a region of a second terminal of the transistor, adjacent to a region of a second terminal of the transistor, and a plurality of third contact regions of the first type of conductivity adjacent to a plurality of regions of a third terminal of the transistor interposed each other by opportune insulating shapes.

Thanks to the present invention it is possible to realize a remarkable saving of silicon area.

Moreover it is possible to have a better coupling of the electric characteristics of the device.

Moreover it is possible to have a simplification of the interconnections among the several devices of the circuit.

Moreover it is possible to have an optical shield of the multi-emitter bipolar devices constituting the bandgap reference circuit.

In particular, this last advantage allows a better stability of the voltage reference in devices with an Ultra Violet (UV) erasing package and, in general, for the steps of Electrical Wafer Sort (EWS), that is for the testing steps on wafer of every single chip even if it is not make in the dark.

BRIEF DESCRIPTION OF THE DRAWINGS

The features and the advantages of the present invention will be made evident by the following detailed description of embodiments thereof which are illustrated as non-limiting examples in the annexed drawings, wherein.

DESCRIPTION OF THE PREFERRED EMBODIMENTS

Figure 1:
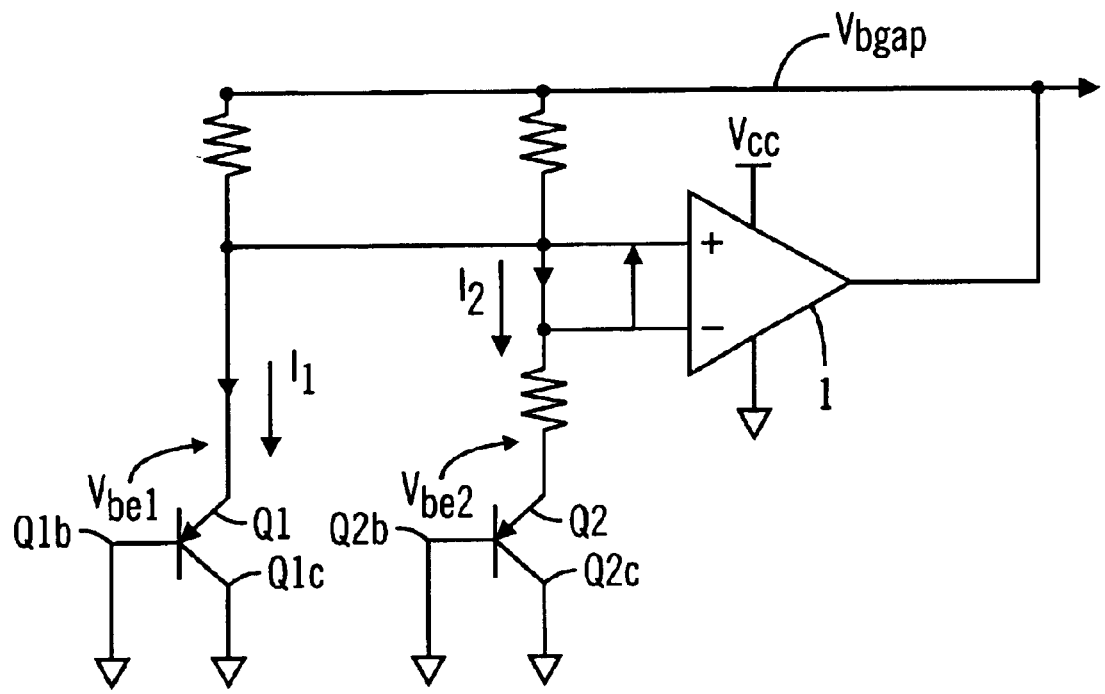
FIG. 1 shows a reference bandgap circuit according to the prior art.

In FIG. 1 a reference bandgap circuit according to the prior art is shown, wherein a reference supply line Vbgap and a couple of pnp bipolar transistor Q1 and Q2 that are connected as diode, that is having the respective base Q1*b* and Q2*b* and collector Q1*c* and Q2*c* electrodes short circuited, are noted.

The way of working provides for comparing, by means of a differential amplifier 1, connected at a side to a supply voltage Vcc and at the other side to ground, the voltage drops Vbe1 and Vb2 caused by the currents I1 and I2 that flow on the respective emitter branches of the transistors Q1 and Q2.

Moreover such a circuit must cause the currents I1 and I2 to be constant by means of a feedback system.

The currents that flow in the two branches must be one the exact multiple of the other, particularly I2=n*I1.

To obtain this, it is well known to a skilled person to realize a bipolar transistor Q2 repeating "n" times the bipolar transistor Q1, as shown in FIG. 1.

Figure 2:
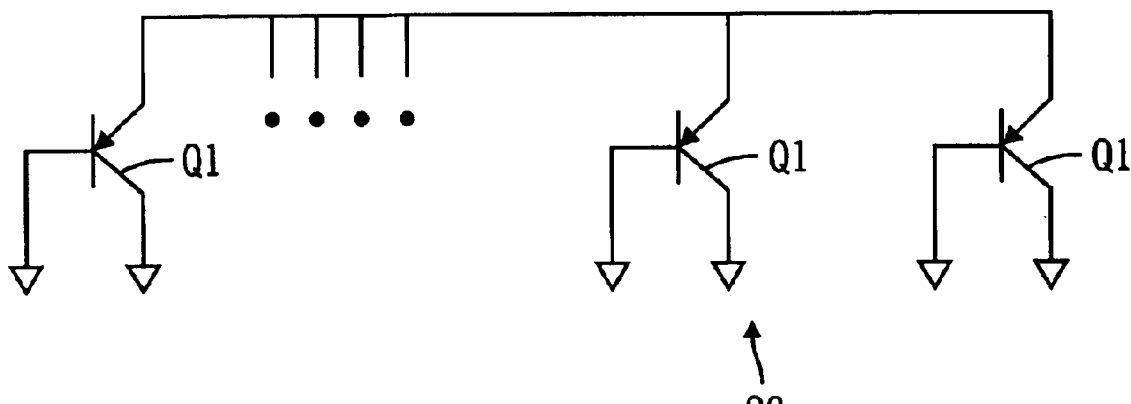
FIG. 2 shows in particular a device of FIG. 1.

In fact Q2 is made as a copy of "n" transistors Q1, all transistors being connected in parallel, as shown in FIG. 2.

Moreover, as it is well known, the vertical bipolar transistors Q1 and Q2 are made on a silicon wafer making proper full use of some steps, masks and necessary structures for the implementing of complementary MOSFETs, that is CMOS (not shown in Figure), inside the bandgap reference circuit.

Figure 3:
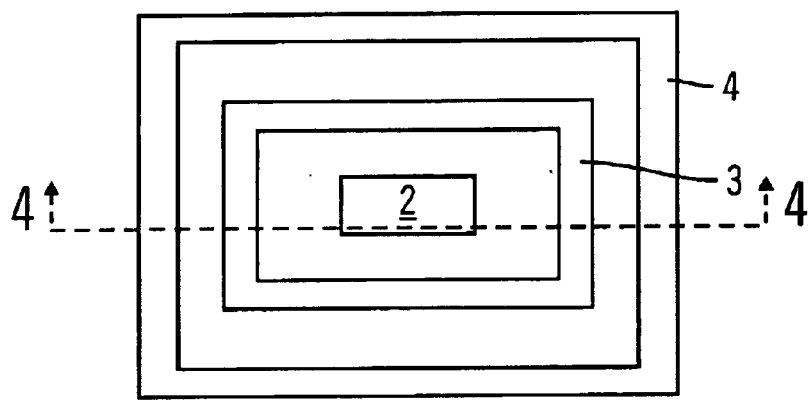
FIG. 3 shows a top plan view of a pnp bipolar transistor according to the prior art.

In FIG. 3 a top plan view of a pnp bipolar transistor according to the prior art is shown.

In a technological process of CMOS type, the availability of a P+ type typical implant 2, for the realization of the source and drain junctions of the MOSFET transistors, and of N type well 3, wherein the conductive channel of the p type MOSFET transistors is made and of a substrate 4 of the CMOS device, allows to realize a pnp type vertical bipolar transistor, without any dedicated process steps.

In fact the P+ type implant 2 represents the emitter and the collector electrode of the pnp vertical transistor, while the N type well 3 represents the base electrode of the pnp vertical transistor.

Figure 4:
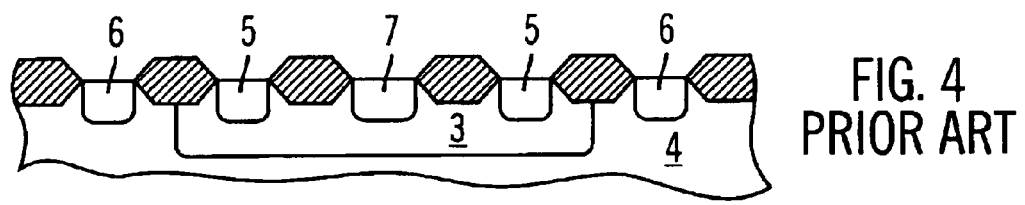
FIG. 4 shows the device of FIG. 3 along the section line IV—IV.

In FIG. 4 a view of the device of FIG. 3 along the section line IV—IV is shown and the sections of the N+ type implant ring 5 in the base region and the P+ type implants 6 and 7 in the collector and emitter region of the vertical bipolar transistor, adapted to contact respectively the base, the collector and the emitter, are noted.

The P+ type diffusion 7 of the emitter can be projected in function of the particular needs which the transistor has to respect according the known technology.

The building of a pnp vertical transistor must take into account the geometrical size of the bipolar transistor itself, because this behaves as vertical bipolar transistor only when the distance between the emitter and collector electrodes in the longitudinal direction is bigger than the thickness of the base region, otherwise the resulting bipolar transistor behaves as lateral bipolar transistor.

Figure 5:
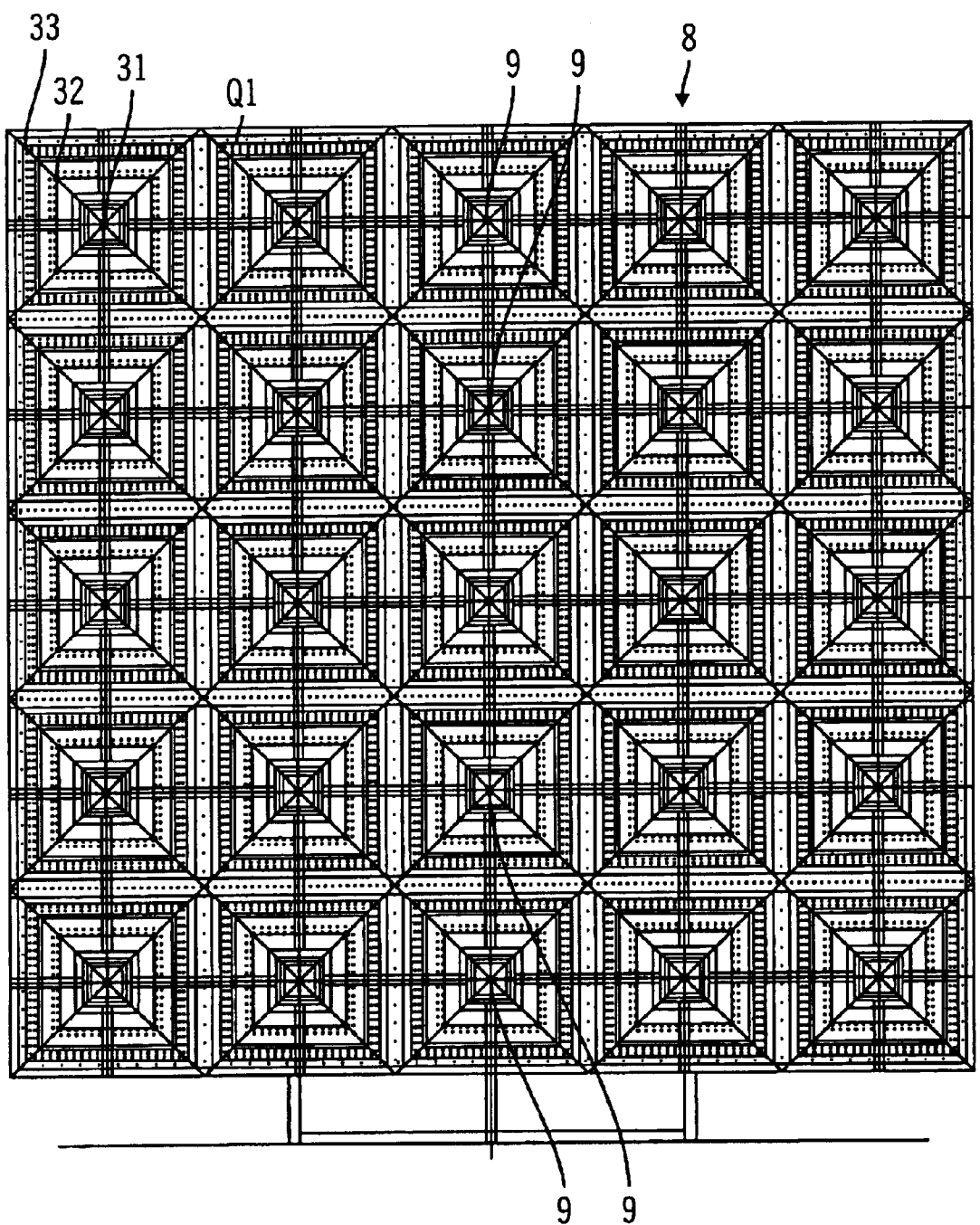
FIG. 5 shows an embodiment of a matrix structure of the reference circuit according to the prior art.

When a bandgap circuit on a layout is realized, in order to have a good reproducibility of the currents, a matrix structure 8 is realized, as shown in FIG. 5.

Such a matrix structure 8 represents, in the specific embodiment, a matrix having five columns by five rows, in the cross-points of which there are some transistors placed but not used.

At every cross-point of the structure 8 there is, therefore, the representation of a pnp type bipolar transistor Q1, repeated n times. In fact in the center of every cross there is the emitter terminal 31, and moving through the board of the device, the base terminal 32 and the collector terminal 33 is found.

The other transistors are placed around it and eventually some other transistors are not connected and not used. This is to obviate the defects of symmetry of the structure and to reproduce the currents as similarly as possible.

Figure 6:
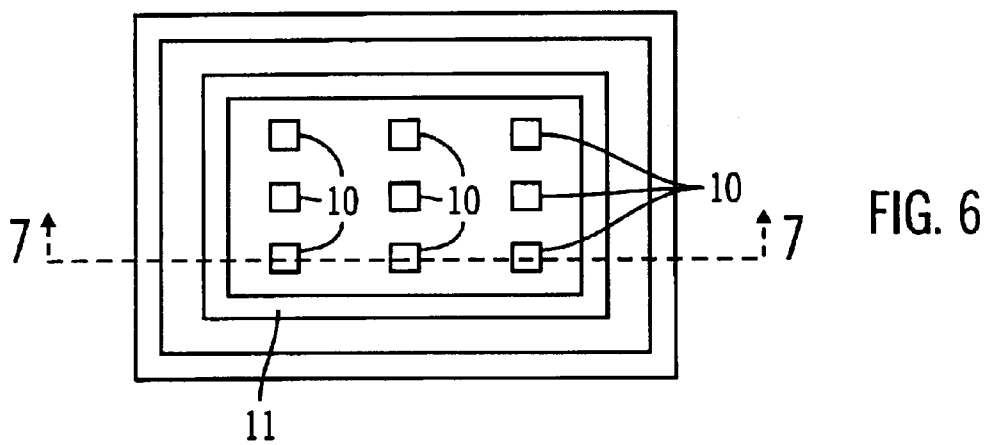
FIG. 6 shows a top plan view of a pnp bipolar transistor according to a preferred embodiment of the present invention.

In FIG. 6 a top plan view of a pnp bipolar transistor made by a CMOS technology according to the present invention is shown.

As shown in such a Figure, the inventive solution provides for only one N type well 11, adapted to contain the "n+1" P+ type implants 10.

The N type well 11 represents the base electrode, while the "n+1" implants represent the pnp bipolar emitters.

Figure 7:
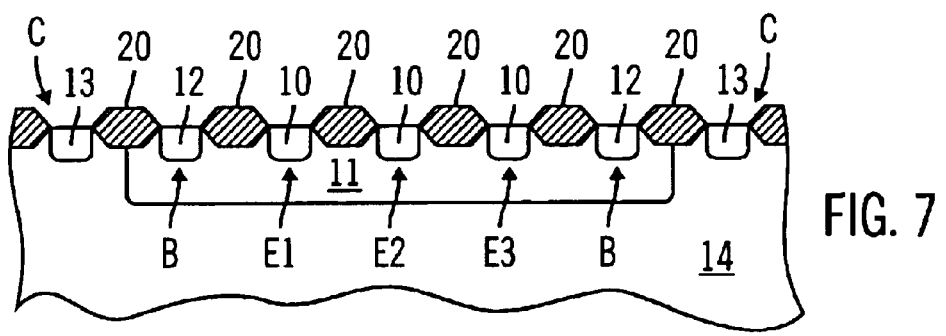
FIG. 7 shows the device of FIG. 6 along the section line VI—VI.

In FIG. 7 the device of FIG. 6 along the section line VI—VI is shown, wherein a P type substrate 14, making the collector, that results connectable by means of a P+ type ring 13 that rounds all the inventive structure, and the N type well 11, making the base, connected by means of N+ type ring 12, are noted. The N type well 11 contains the "n+1" emitters 10, made by the P+ type implants.

What is represented in such a Figure, therefore, it is a pnp type bipolar transistor, having the P type substrate 14 with a P+ type contact region 13 adjacent to its collector terminal C, and the N type well 11 with N+type contact regions 12 adjacent to its base terminal B and with P+ type contact regions adjacent to their emitter terminals E1, . . . , E3.

Suitable structures 20, such as oxides or junction wells, to isolate the emitters E1, . . . , E3 with respect to each other and the well 12 are provided.

It is to be noted that this structure is possible because the traditional bandgap circuit provides that the base and collector short circuited to the ground.

Figure 8:
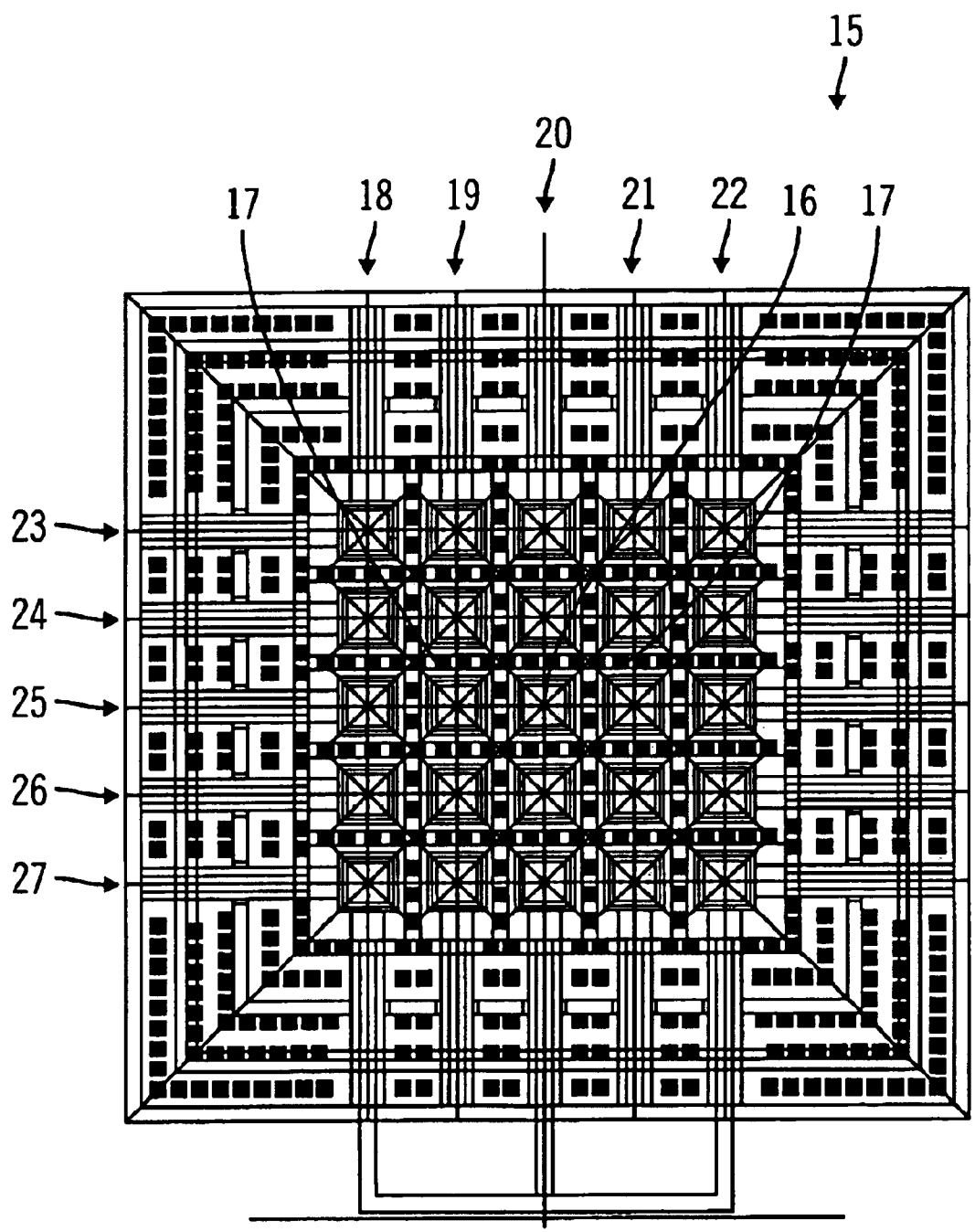
FIG. 8 shows an embodiment of a matrix structure of the reference circuit according to a preferred embodiment of the present invention.

In FIG. 8 an embodiment of a matrix structure of the reference circuit according to the present invention is shown.

In such a Figure a matrix 15 that results to have five columns 18, . . . , 22 and five rows 23, . . . , 27.

At every cross an emitter electrode is placed that is interconnected or floating with respect to the other emitter electrodes.

From the specific embodiment shown in FIG. 8, a matrix 15 results having an interconnection scheme such as that described in the successive table:

|    | 18 | 19 | 20 | 21 | 22 |
|----|----|----|----|----|----|
| 23 | x  | e  | x  | e  | x  |
| 24 | e  | e  | x  | e  | e  |
| 25 | e  | x  | E  | x  | e  |
| 26 | e  | e  | x  | e  | e  |
| 27 | x  | e  | x  | e  | x  | where "x" indicates a floating emitter, "e" an emitter interconnected with the other emitters and "E" an emitter of the single side.

The matrix 15 results to be perfectly symmetrical and with better matching characteristics, that is the transistors are much more similar to each other, with respect to the traditional embodiments. This because a structure 16 is repeated more times and it is so as to have structures 17 equal to the structure 16 and connected to each other with the lower number of interconnections.

In this way the transistor that must be used alone, that is in the single branch of the reference bandgap circuit and is indicated with the symbol "E" in the previous table, is arranged in the center of the matrix 15, so that the matrix 15 itself is realized with the highest number of implementable transistors, so as to increase the system symmetry and therefore the reproducibility of the transistors.

Making the matrix 15 with "n+1" emitters near each other, the matching is enhanced both for the smaller occupied area and because it is not necessary to short circuit every base and collector electrode with metal lines.

Inserting the "n+1" emitters in the base 11, multiple advantages are obtained such as, for example: a) saving of silicon area, because by inserting the "n+1" emitters in a N type unique well 11 the only law to be respected is the minimum distance between the active areas of the emitters 10; b) it is not necessary to short circuit the bases and the collectors each other with metal lines, but with the present invention it is sufficient to short circuit only the unique large base and the collector; c) not short circuiting the bases and the collectors allows to contact the n emitters with each other and the central emitter with an operational amplifier (not shown in Figure) with a structure of interconnection wherein intercrosses among the bases and collector do not exist.

This last advantage gives the possibility to let the higher interconnection level free to be, therefore, used as an optical shield against the light for the whole system of transistors adapted to generate the bandgap voltage, in the case the integrated circuit is mounted onto an UV erasing package, for example, for EPROM memories.

Moreover the possibility to have this shield allows that the EWS phase on wafer can develop with a biased circuit and not in the dark because the shield guaranties the stability of the bandgap circuit and therefore also of the bandgap voltage.

Other embodiments, according to the present invention, are depicted in the following tables:

|       | $C^1$ | $C^2$ | $C^3$ | $C^4$ | $C^5$ |
|-------|-------|-------|-------|-------|-------|
| $R^1$ | e     | e     | x     | e     | x     |
| $R^2$ | e     | e     | e     | e     | e     |
| $R^3$ | e     | e     | E     | e     | e     |
| $R^4$ | e     | e     | e     | e     | e     |
| $R^5$ | x     | e     | x     | e     | x     | where $R^1, \ldots, R^5$ are the number of the rows an $C^1, \ldots, C^5$ are the number of the columns and "x", "e" and "E" indicates respectively the floating emitter, the emitter interconnected with the other emitters and the emitter of the single side;

|       | $C^1$ | $C^2$ | $C^3$ |
|-------|-------|-------|-------|
| $R^1$ | e     | x     | x     |
| $R^2$ | x     | E     | x     |
| $R^3$ | e     | x     | E     | where $R^1, \ldots, R^3$ are the number of the rows and $C^1, \ldots, C^3$ are the number of the columns and, again, "x", "e" and "E" indicates respectively the floating emitter, the emitter interconnected with the other emitters and the emitter of the single side;

|       | $C^1$ | $C^2$ | $C^3$ |
|-------|-------|-------|-------|
| $R^1$ | x     | e     | x     |
| $R^2$ | e     | E     | e     |
| $R^3$ | x     | e     | x     | where $R^1, \ldots, R^3$ are the number of the rows and $C^1, \ldots, C^3$ are the number of the columns and, again, "x", "e" and "E" indicates respectively the floating emitter, the emitter interconnected with the other emitters and the emitter of the single side;

|       | $C^1$ | $C^2$ | $C^3$ |
|-------|-------|-------|-------|
| $R^1$ | e     | e     | e     |
| $R^2$ | e     | E     | e     |
| $R^3$ | e     | e     | e     | where $R^1, \ldots, R^3$ are the number of the rows and $C^1, \ldots, C^3$ are the number of the columns and, again, "e" and "E" indicates respectively the emitter interconnected with the other emitters and the emitter of the single side.

In the present embodiments pnp type vertical bipolar transistor are used, but the inventive solution also provides for bandgap reference circuits made by npn type bipolar transistors connected in diode configuration.

The present invention is destined, therefore, both to standard CMOS processes, EPROM processes, and other specific processes such as, for example, BCD and/or BiCMOS, if in the reference branches a bipolar connected as diode is used.

While there has been illustrated and described what are presently considered to be the preferred embodiments of the present invention, it will be understood by those of ordinary skill in the art that various other modifications may be made, and equivalents may be substituted, without departing from the true scope of the present invention.

Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A connection matrix for a multi-emitter bipolar transistor comprising:
   a plurality of columns and a plurality of rows an emitter electrode being provided at every crossing of the plurality of columns and of the plurality of rows, wherein the multi-emitter bipolar transistor has an emitter electrode of single side in the central crossing of the plurality of columns and of the plurality of rows, the multi-emitter bipolar transistor having a first plurality of emitter electrodes interconnected with each other and the first plurality of emitter electrodes placed in a symmetric configuration with respect to the emitter electrode of single side.

2. The connection matrix according to claim 1, wherein the multi-emitter bipolar transistor has a second plurality of emitter electrodes placed in a symmetric configuration with respect to the emitter electrode of single side, the second plurality of emitter electrodes being floating.

3. The connection matrix according to claim 2, wherein the first and second pluralities of emitter electrodes are alternated with each other.

4. An electronic device comprising:

a circuit supporting substrate; and at least one bipolar transistor disposed on the circuit supporting substrate, each of the at least one bipolar transistor comprising:

a plurality of columns and a plurality of rows, an emitter electrode being provided at every crossing of the plurality of columns and of the plurality of rows, and wherein each of the at least one bipolar transistor having an emitter electrode of single side in the central crossing of the plurality of columns and of the plurality of rows, and wherein each of the at least one bipolar transistor having a first plurality of emitter electrodes placed in a symmetric configuration with respect to the emitter electrode of single side.

5. The electronic device of claim 4, wherein the first plurality of emitter electrodes are interconnected with each other.

6. The electronic device of claim 5, wherein each of the at least one bipolar transistor has a second plurality of emitter electrodes placed in a symmetric configuration with respect to the emitter electrode of single side, the second plurality of emitter electrodes being floating.

7. The electronic device of claim 4, wherein each of the at least one bipolar transistor has the first plurality of emitter electrodes interconnected with each other and a second plurality of emitter electrodes placed in a symmetric configuration with respect to the emitter electrode of single side, the second plurality of emitter electrodes being floating.

8. The electronic device of claim 4, wherein each of the at least one bipolar transistor has a second plurality of emitter electrodes placed in a symmetric configuration with respect to the emitter electrode of single side, the second plurality of emitter electrodes being floating, and wherein the first and second pluralities of emitter electrodes are alternated with each other.

* * * * *